(12) United States Patent
Chou

(10) Patent No.: US 12,618,922 B2
(45) Date of Patent: May 5, 2026

(54) NUCLEAR MAGNETIC RESONANCE SPECTROMETER

(71) Applicant: Ching-Yu Chou, New Taipei City (TW)

(72) Inventor: Ching-Yu Chou, New Taipei City (TW)

( * ) Notice: Subject to any disclaimer, the term of this patent is extended or adjusted under 35 U.S.C. 154(b) by 453 days.

(21) Appl. No.: 18/138,755

(22) Filed: Apr. 25, 2023

(65) Prior Publication Data

US 2024/0264253 A1      Aug. 8, 2024

(30) Foreign Application Priority Data

Feb. 3, 2023    (TW) ................................. 112201000

(51) Int. Cl.
G01R 33/34        (2006.01)
G01R 33/46        (2006.01)
(52) U.S. Cl.
CPC ............. G01R 33/34 (2013.01); G01R 33/46 (2013.01)
(58) Field of Classification Search
CPC ...... G01N 24/08; G01R 33/307; G01R 33/34; G01R 33/46
See application file for complete search history.

(56) References Cited

U.S. PATENT DOCUMENTS

| | | | | |
|---|---|---|---|---|
| 2010/0327866 A1* | 12/2010 | Albu | ...................... | G01N 24/08 |
| | | | | 324/304 |
| 2011/0193559 A1* | 8/2011 | Marumoto | ............. | G01N 24/10 |
| | | | | 324/304 |
| 2019/0107592 A1* | 4/2019 | Huber | .................. | G01R 33/307 |
| 2023/0213600 A1* | 7/2023 | Golovanov | ............ | G01R 33/30 |
| | | | | 324/316 |

* cited by examiner

*Primary Examiner* — Judy Nguyen
*Assistant Examiner* — Adam S Clarke
(74) *Attorney, Agent, or Firm* — Juan Carlos A. Marquez; Marquez IP Law Office, PLLC

(57)                ABSTRACT

A nuclear magnetic resonance spectrometer is provided, including a body, a moving mechanism, a driving device, a probe, a superconducting magnet, and a light source. The moving mechanism is disposed on the body and includes a sample tube. The driving device is disposed on the body and is used to drive the moving mechanism to move the sample tube. The probe is disposed inside the body and under the moving mechanism, and has a channel for the sample tube to enter the probe. The superconducting magnet is disposed inside the body and located at the outer side of the probe. The light source is disposed inside the body, and is located outside the moving path of the sample tube or above the sample tube.

15 Claims, 18 Drawing Sheets

60

61

631

63

60

60A

61A

63A

61A

60A

60A

NUCLEAR MAGNETIC RESONANCE SPECTROMETER

CROSS-REFERENCE TO RELATED APPLICATION

This application claims the priority of Taiwanese patent application No. 112201000, filed on Feb. 3, 2023, which is incorporated herewith by reference.

BACKGROUND OF THE INVENTION

1. Field of the Invention

The present invention relates generally to a nuclear magnetic resonance (NMR) spectrometer.

2. The Prior Arts

Direction
Irradiation of samples during NMR measurements is used in a variety of applications such as photochemically induced dynamic nuclear polarization (photo-CIDNP), ultraviolet-visible (UV-VIS) spectrum in NMR, photo-irradiated trans-cis conversion, and any photo-catalyst research topic.

In the magnetic field of the nuclear magnetic resonance spectrometer, due to the restriction of geometric shape and material limitations, light sources such as lasers or light-emitting diodes can only be disposed on the outside of the housing of the Dewar bottle of the NMR spectrometer. In order to irradiate the sample with the light emitted by the light source, conventional NMR spectrometers must be coupled to the light source via an optical fiber extending into a channel in the housing of the NMR spectrometer and inserted into a sample tube containing the sample. The optical fiber can guide the light emitted by the light source into the sample tube to irradiate the sample in the sample tube.

However, the optical fiber hinders the movement of the sample during transporting the sample between positions of different magnetic field magnitudes in the NMR spectrometer and irradiating the sample with light.

SUMMARY OF THE INVENTION

A primary objective of the present invention is to provide a nuclear magnetic resonance (NMR) spectrometer, wherein the light source can directly irradiate the sample tube inside the body and will not hinder the movement of the sample tube.

In order to achieve the aforementioned objective, the invention provides a nuclear magnetic resonance spectrometer, including a body, a moving mechanism, a driving device, a probe, a superconducting magnet, and a light source. The moving mechanism is disposed on the body and includes a sample tube. The driving device is disposed on the body and is used to drive the moving mechanism to move the sample tube. The probe is disposed inside the body and under the moving mechanism, and has a channel for the sample tube to enter the probe. The superconducting magnet is disposed inside the body and located at the outer side of the probe. The light source is disposed inside the body, and is located outside the moving path of the sample tube or above the sample tube.

In a preferred embodiment, the light source includes a base and at least one light-emitting element, the base is disposed on the moving mechanism, located at an outer side the moving path of the sample tube, and parallel to the moving path of the sample tube; the at least one light-emitting element is fixed to the base.

In a preferred embodiment, the light source further includes a reflective element, the reflective element is disposed on the base and has a reflective hole, and the at least one light-emitting element is located in the reflective hole.

In a preferred embodiment, inner surface of the reflective hole is an optical reflective curved surface.

In a preferred embodiment, the light source includes a plurality of light-emitting elements, and the light emitting elements are arranged in a direction parallel to the length direction of the sample tube.

In a preferred embodiment, the light source includes a base, a light-emitting element, and a light guide, the base is disposed in the moving mechanism and located above the sample tube, and can move along the moving mechanism; the light-emitting element is fixed to the base, the light guide is disposed in the sample tube, and one end of the light guide faces the light-emitting element.

In a preferred embodiment, the light source further includes a reflective element, the reflective element is disposed on the base and has a reflective hole, and the light-emitting element is located in the reflective hole.

In a preferred embodiment, inner surface of the reflective hole is an optical reflective curved surface.

In a preferred embodiment, an axis of the light-emitting element is aligned with an axis of the sample tube.

In a preferred embodiment, when the light source is located above the sample tube, the body includes an adjustment structure, the adjustment structure is connected to the light source and used to adjust the position of the light source in the body.

In a preferred embodiment, the adjustment structure is a rod, and the rod has an adjustable length.

In a preferred embodiment, the moving mechanism further includes a rail and a slider, the rail is disposed on the body and extends into the body, the slider is disposed on the rail, the sample tube is disposed on the slider, the driving device drives the slider to move along the rail, the probe is located below the rail, and the light source is disposed on the rail.

In a preferred embodiment, the light source is disposed in the probe, and is located at an outer side of the moving path of the sample tube.

In a preferred embodiment, the probe has an internal chamber, the chamber communicates with the channel, and the sample tube enters the chamber through the channel; wherein, the light source includes at least one light-emitting element, and the at least one light-emitting element is fixed inside the chamber.

In a preferred embodiment, the light source includes a plurality of light-emitting elements, and the light-emitting elements are arranged in a direction parallel to the length direction of the sample tube.

In a preferred embodiment, the light source surrounds the outside of the chamber, the light source includes a plurality of light-emitting elements, and the light emitting elements are located inside the chamber and distributed around the chamber.

The effect of the present invention is that the light source can directly irradiate the sample tube inside the body, without the need to dispose an optical fiber from the outside into the inside of the body, and the position of the light source is located at an outer side the moving path of the sample tube or the sample tube above, which will not hinder the movement of the sample tube.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
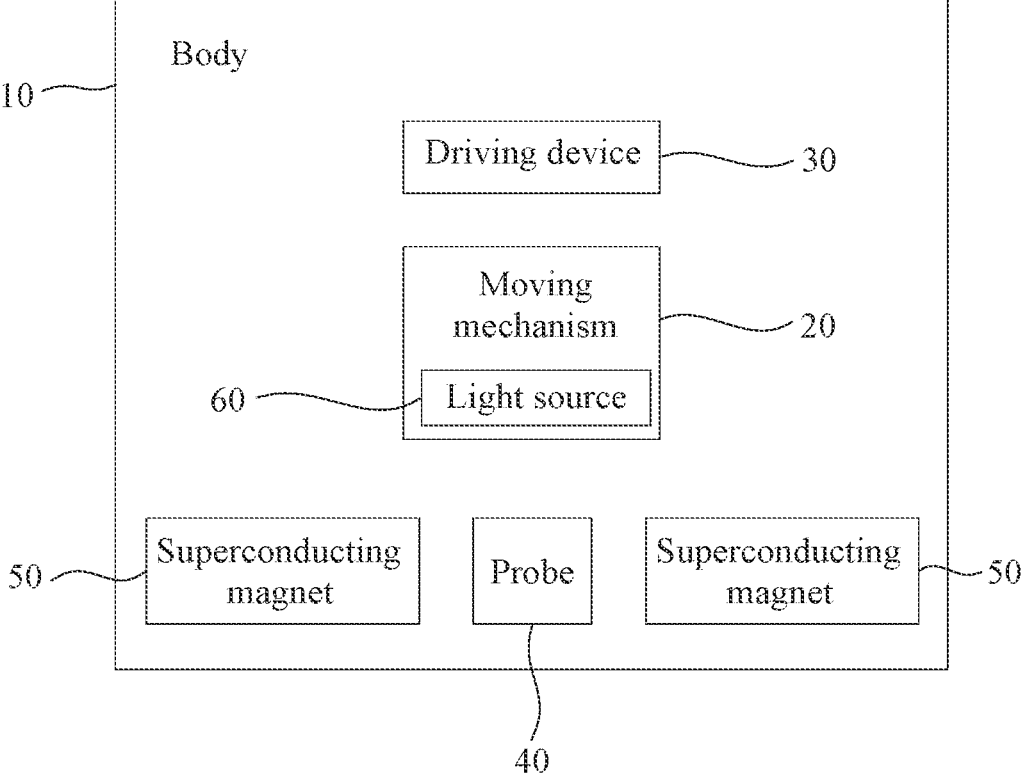
FIG. 1 is a schematic structural view of the first embodiment of the present invention.
Figure 2:
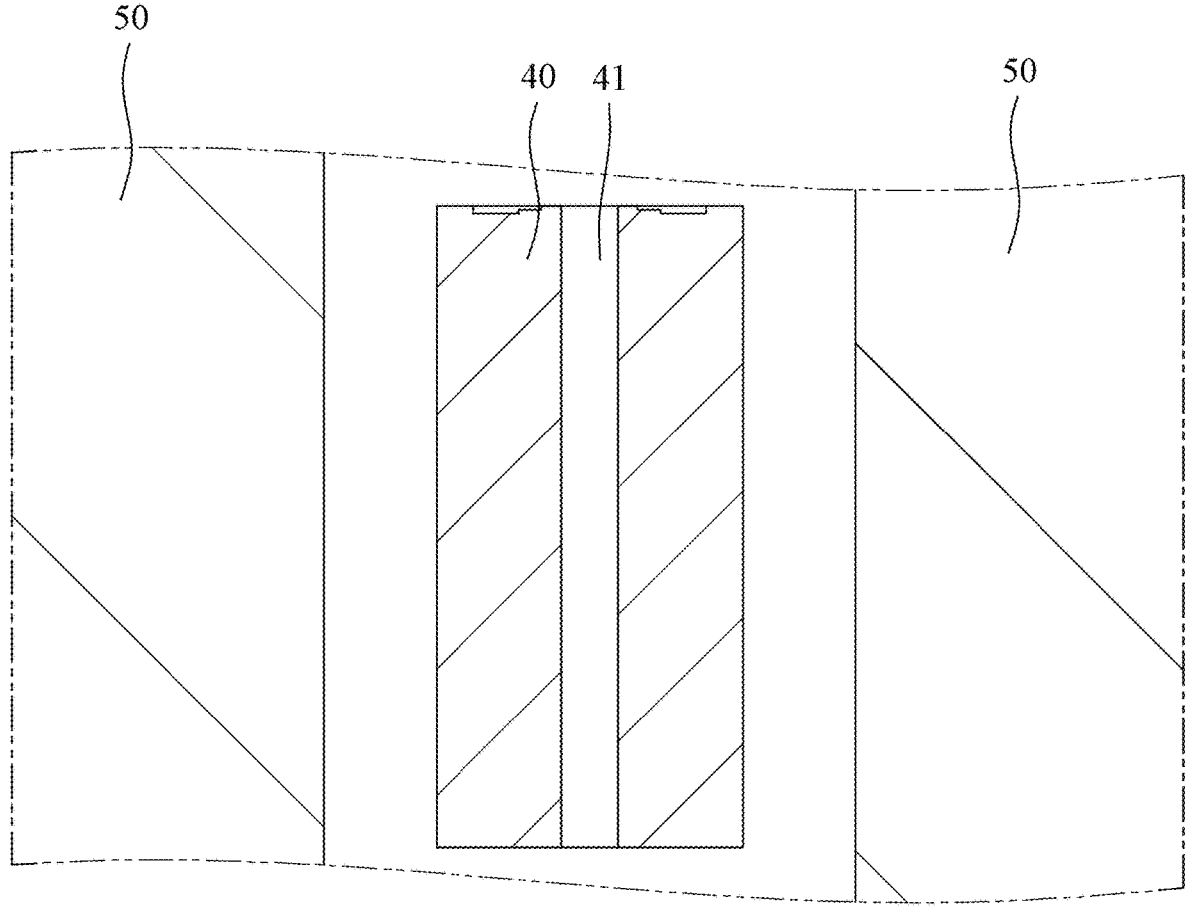
FIG. 2 is a cross-sectional view of the probe and the superconducting magnet of the first embodiment of the present invention.

The accompanying drawings are included to provide a further understanding of the invention, and are incorporated in and constitute a part of this specification. The drawings illustrate embodiments of the invention and, together with the description, serve to explain the principles of the invention.

As shown in FIGS. 1-7, the present invention provides a nuclear magnetic resonance spectrometer, including a body 10, a moving mechanism 20, a driving device 30, a probe 40, a superconducting magnet 50, and a light source 60. The moving mechanism 20 is disposed on the body 10 and includes a sample tube 21. The driving device 30 is disposed on the body 10. The probe 40 is disposed inside the body 10 and located below the moving mechanism 20, and has a channel 41. The superconducting magnet 50 is disposed inside the body 10 and outside the probe 40. The light source 60 is disposed inside the body 10.

The following will illustrate how the first embodiment of the present creation performs nuclear magnetic resonance under different magnetic field illumination.

First, the driving device 30 drives the moving mechanism 20 to move the sample tube 21, so that the sample tube 21 moves toward the light source 60.

Figure 3:
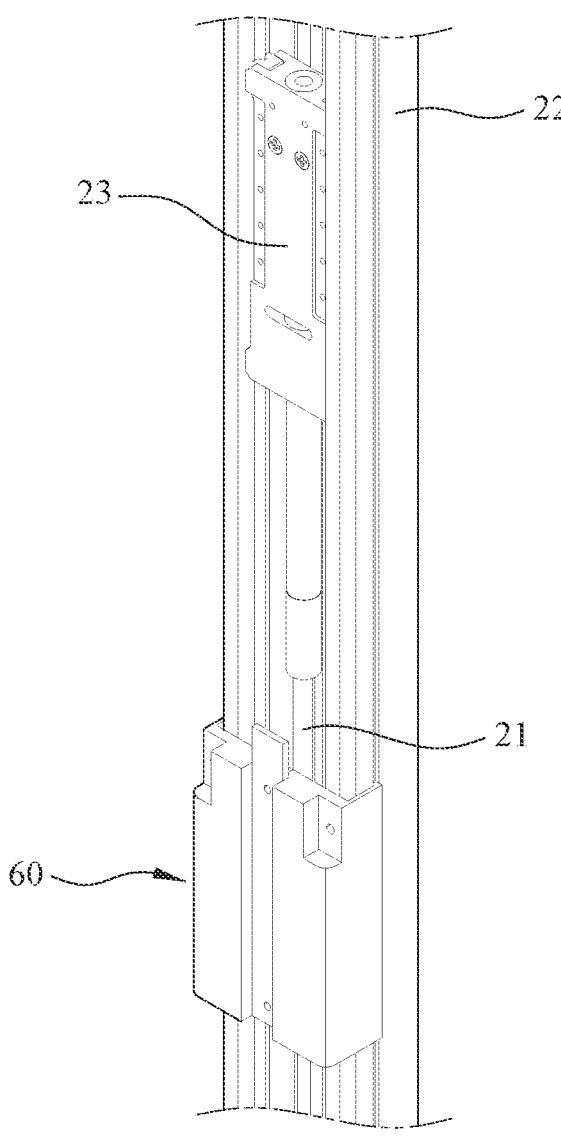
FIG. 3 is a perspective view of the moving mechanism and the light source of the first embodiment of the present invention.
Figure 8:
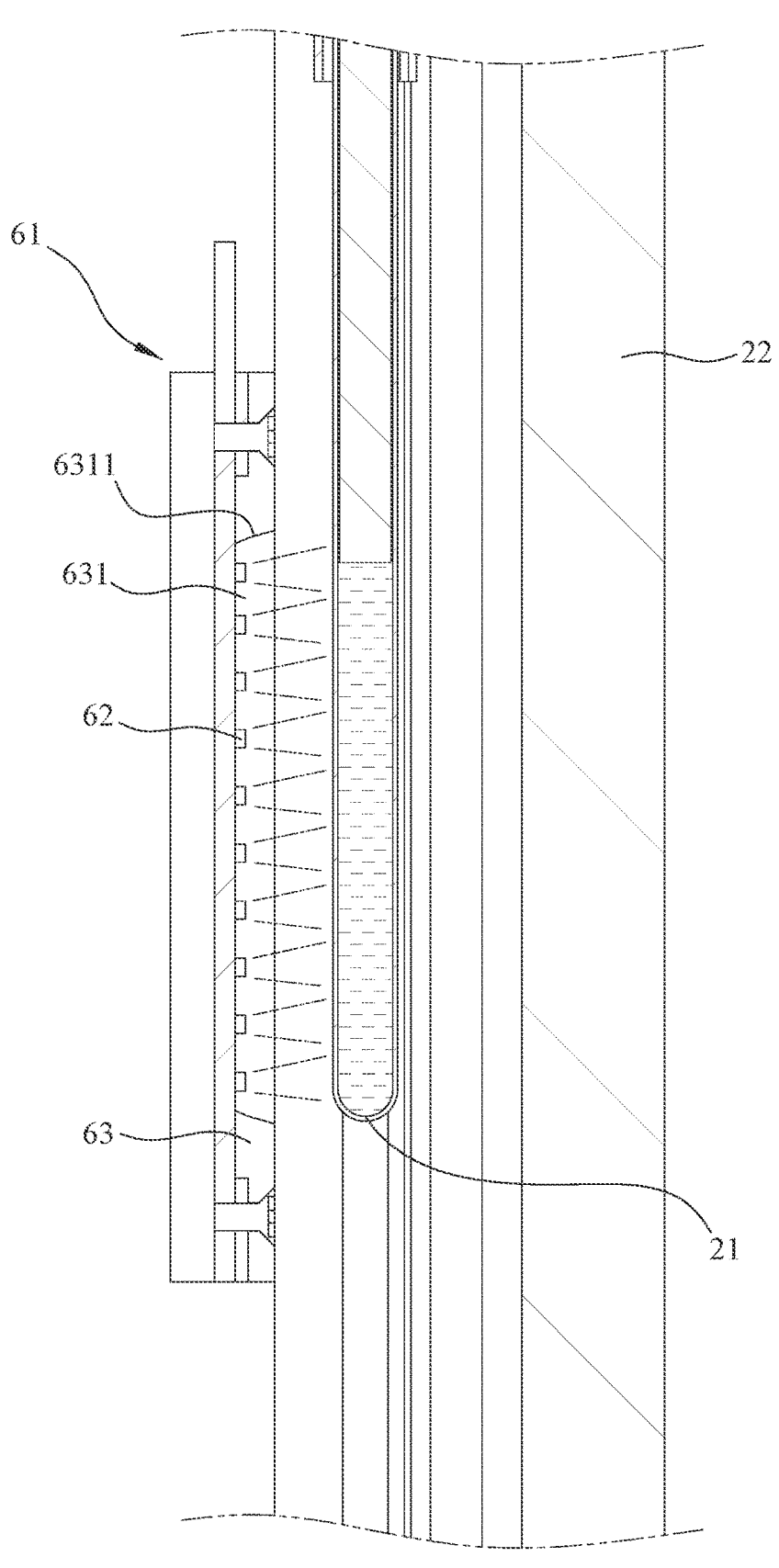
FIG. 8 is a schematic view of the light source emitting light to irradiate the sample tube according to the first embodiment of the present invention.

Next, as shown in FIG. 8 and also referring to FIG. 3, when the moving mechanism 20 moves the sample tube 21 to the inner side of the light source 60, the light source 60 is located at the outer side of the moving path of the sample tube 21. At this point, the light source 60 is activated to emit light, and the light passes through the transparent sample tube 21 to irradiate the sample so that the sample is stimulated by the light to produce a chemical reaction or an enzyme-catalyzed reaction.

Then, after the sample is stimulated by light, the driving device 30 drives the moving mechanism 20 to move the sample tube 21 so that the sample tube 21 moves toward the direction of the probe 40.

Figure 9:
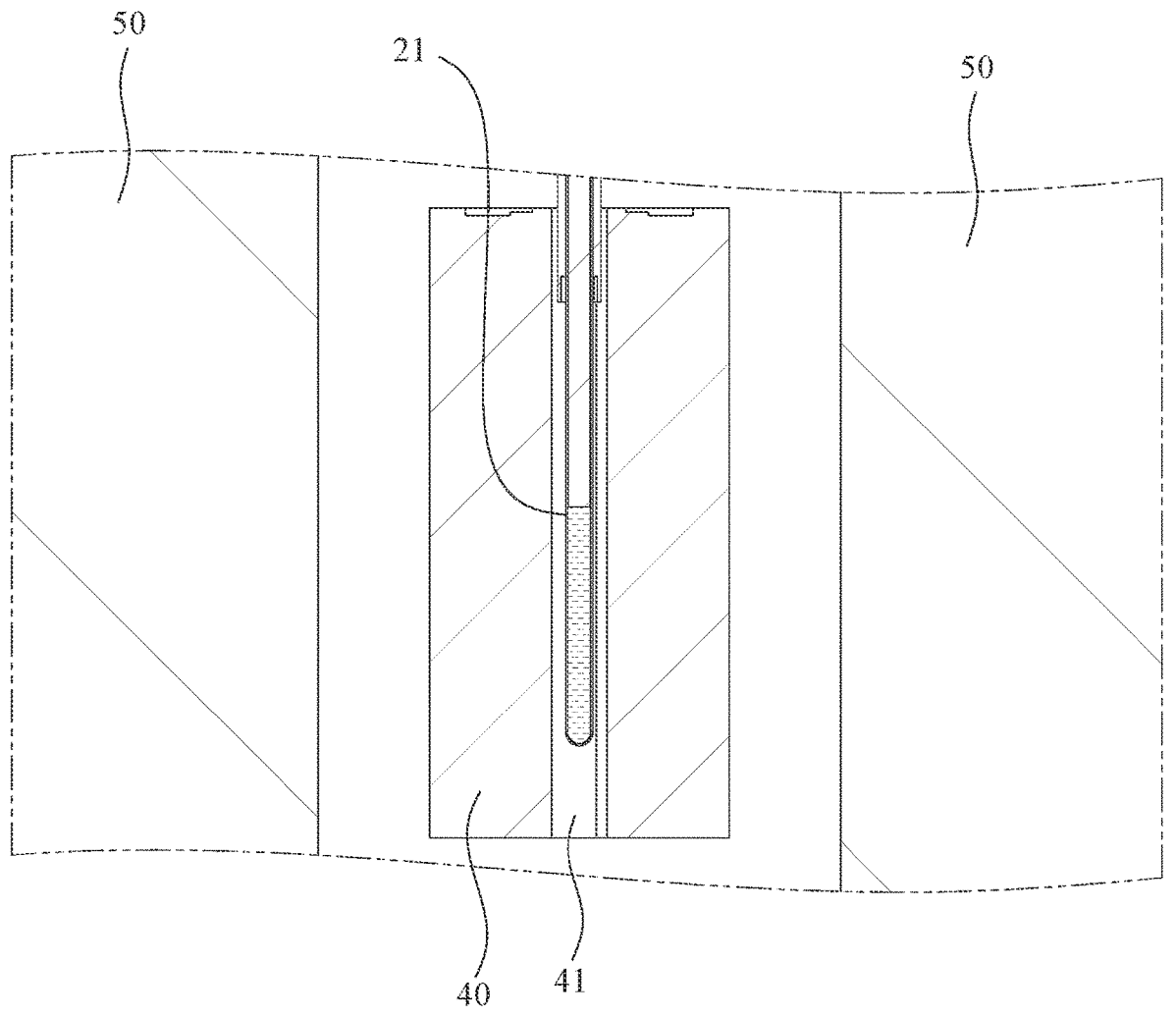
FIG. 9 is a schematic view of the sample tube located inside the probe according to the first embodiment of the present invention.
Figure 10:
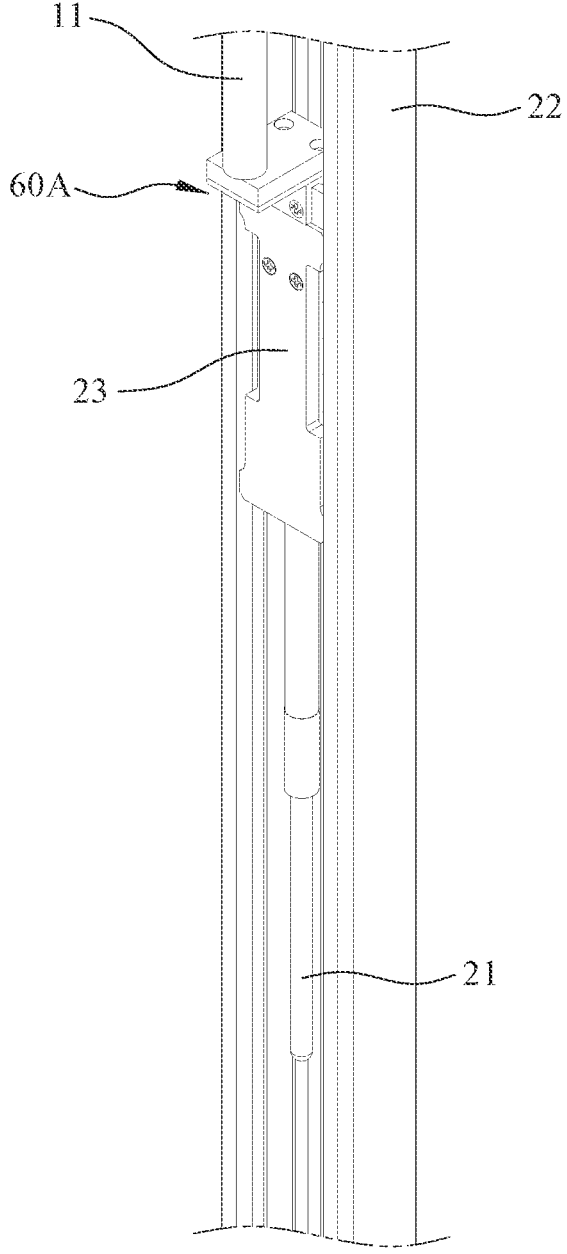
FIG. 10 is a perspective view of the moving mechanism and the light source of the second embodiment of the present invention.
Figure 11:
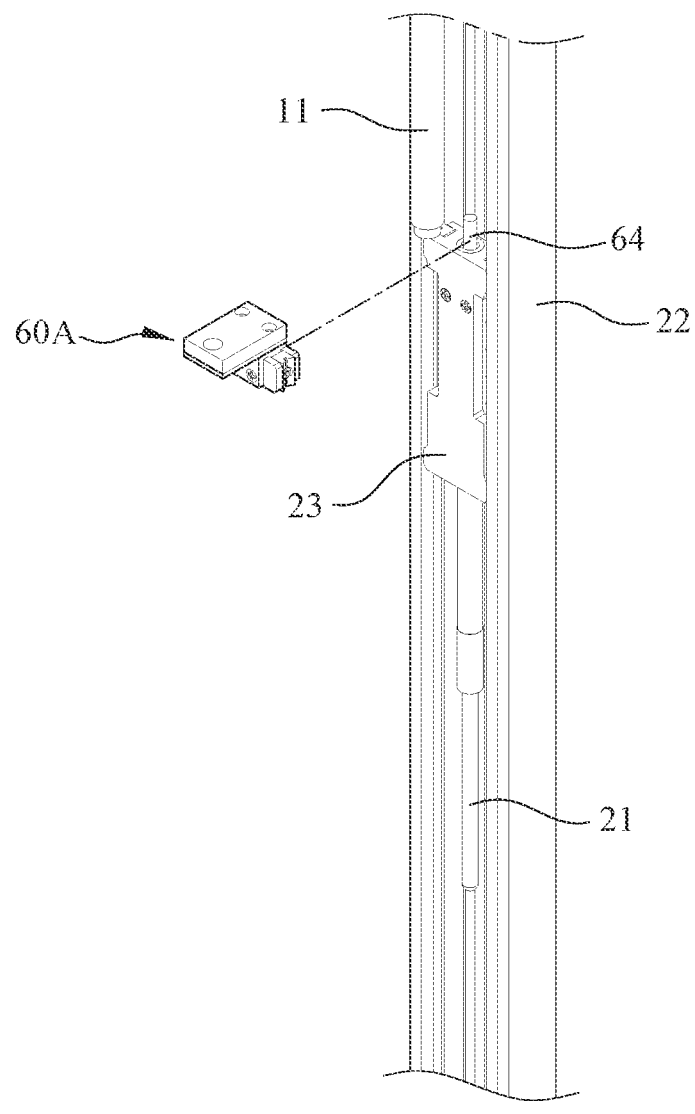
FIG. 11 is an exploded view of the moving mechanism and the light source of the second embodiment of the present invention.
Figure 12:
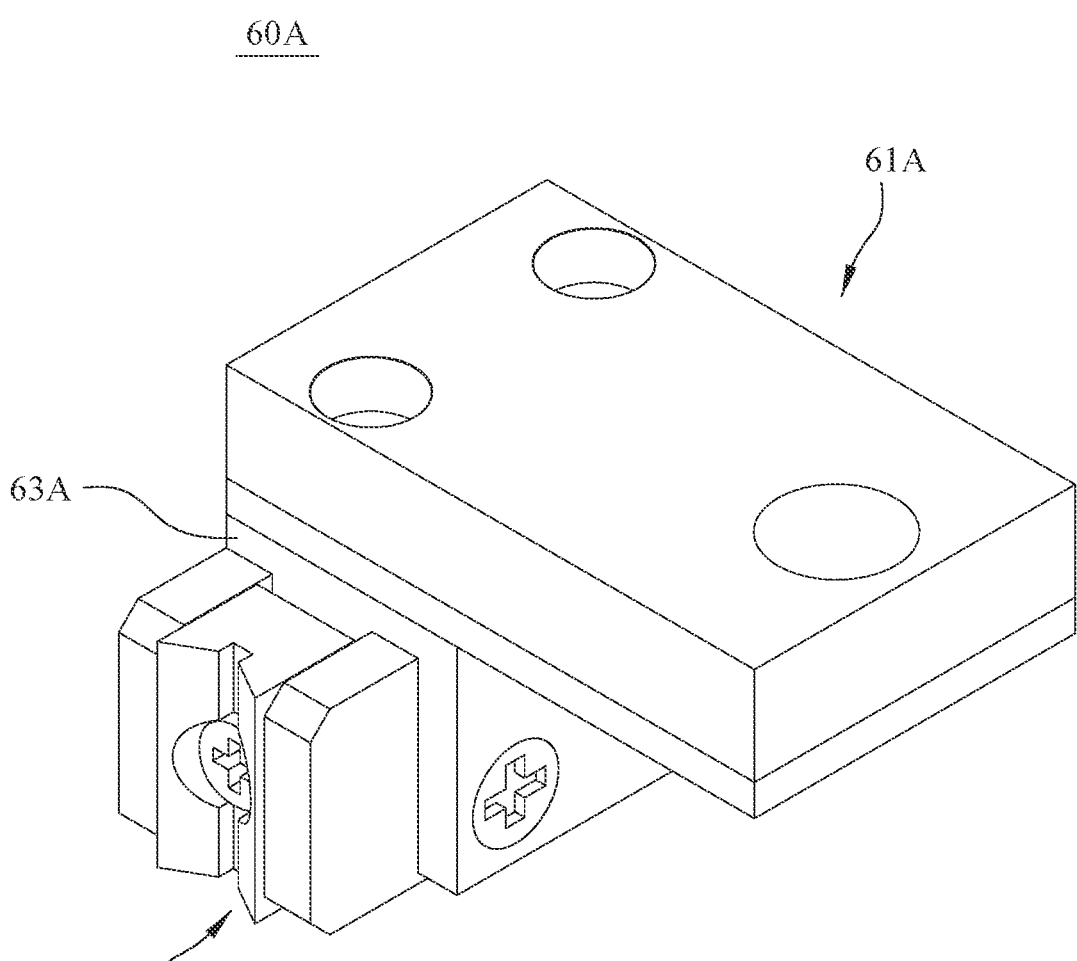
FIG. 12 is a perspective view of the light source of the second embodiment of the present invention.
Figure 13:
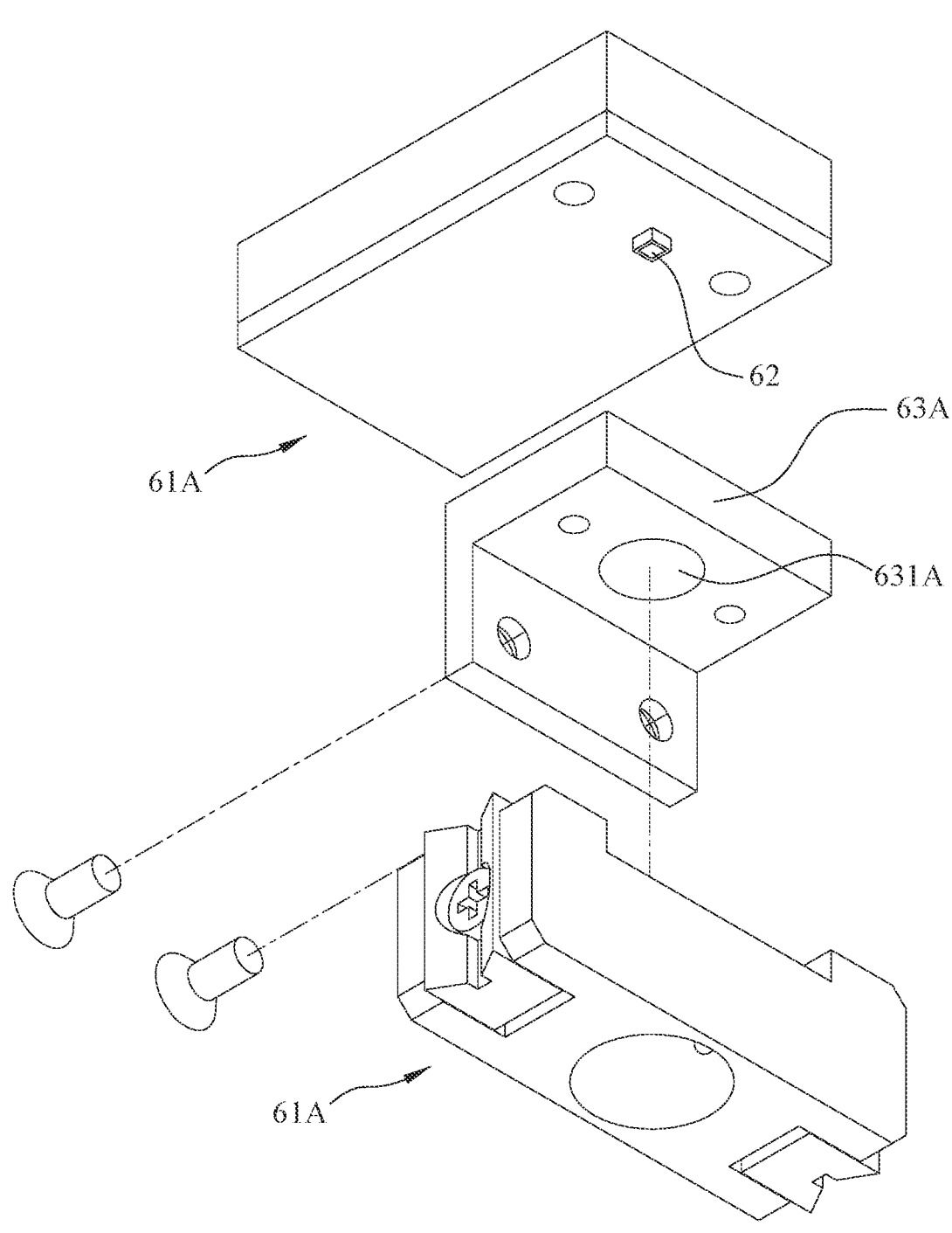
FIG. 13 is an exploded view of the light source of the second embodiment of the present invention.
Figure 14:
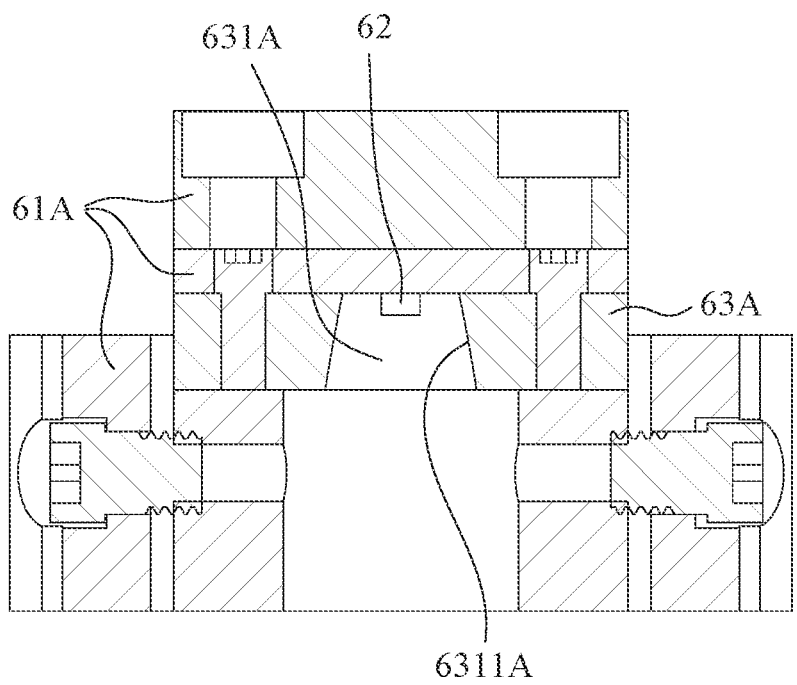
FIG. 14 is a cross-sectional view of the light source of the second embodiment of the present invention.

Finally, as shown in FIG. 9, when the moving mechanism 20 moves the sample tube 21 through the channel 41 of the probe 40 and enters the inside of the probe 40, the probe 40 and the superconducting magnet 50 jointly perform nuclear magnetic resonance on the sample.

Figure 4:
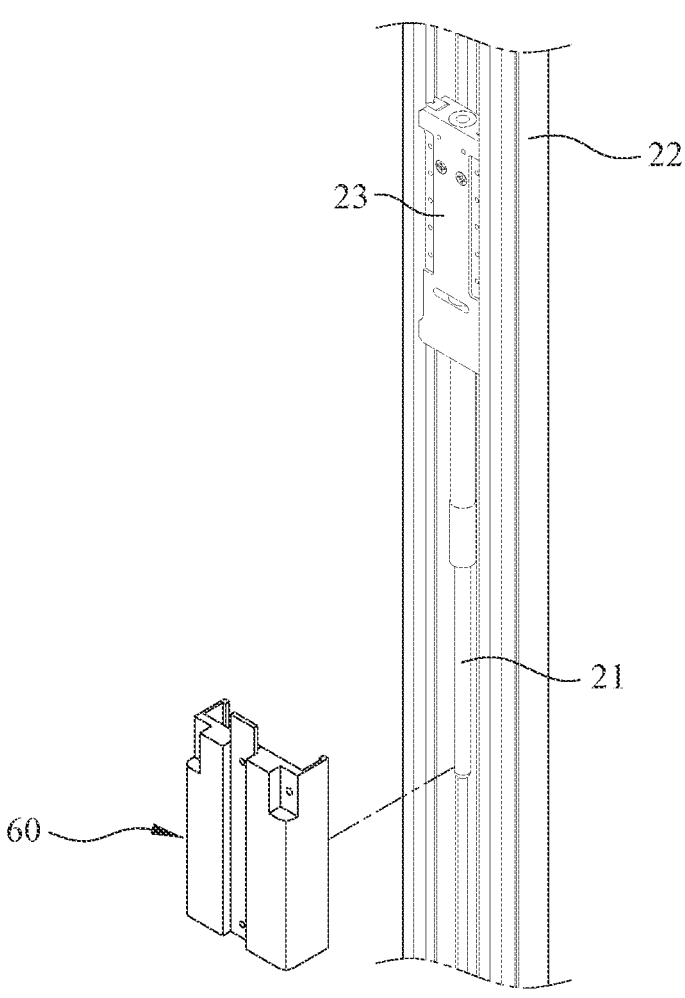
FIG. 4 is an exploded view of the moving mechanism and the light source of the first embodiment of the present invention.
Figure 5:
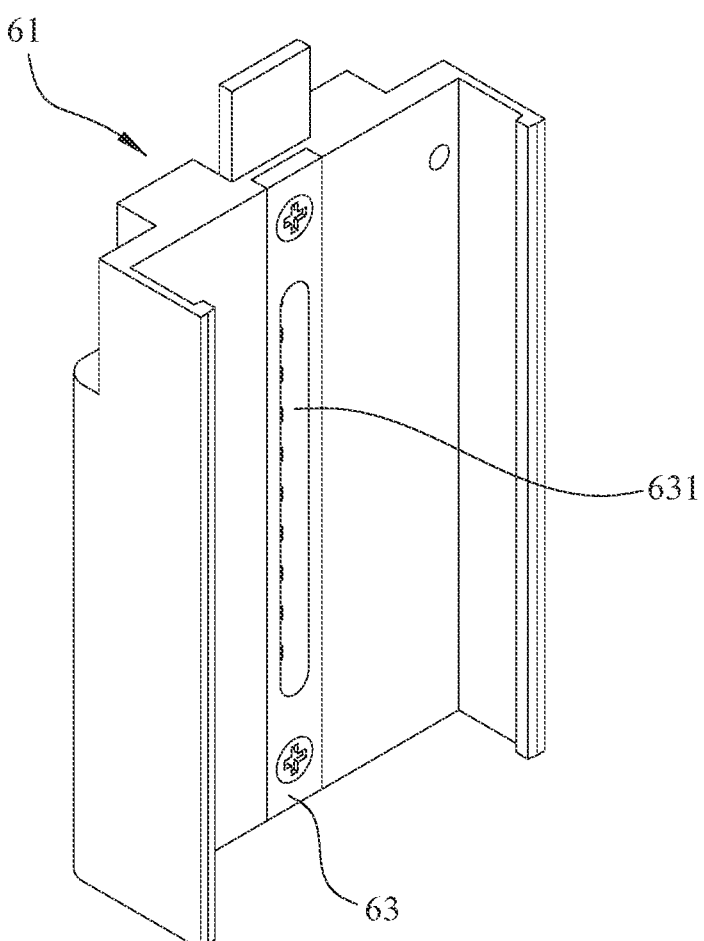
FIG. 5 is a perspective view of the light source of the first embodiment of the present invention.
Figure 6:
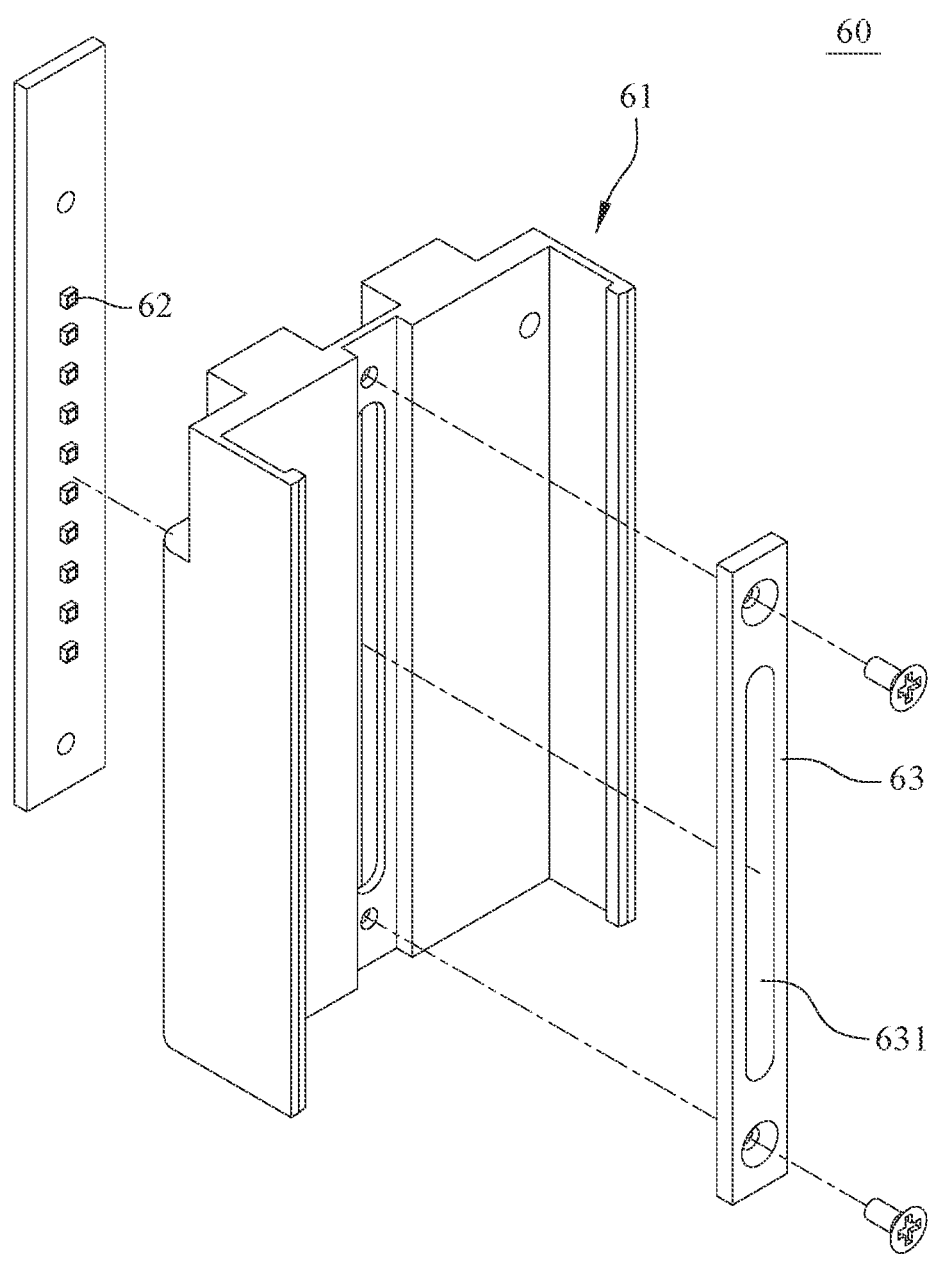
FIG. 6 is an exploded view of the light source of the first embodiment of the present invention.
Figure 7:
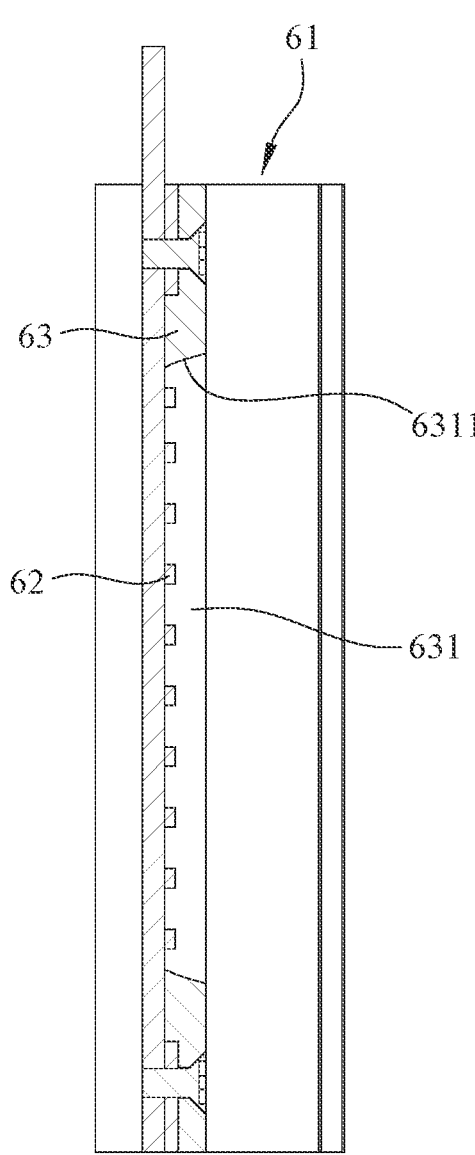
FIG. 7 is a cross-sectional view of the light source of the first embodiment of the present invention.

Preferably, as shown in FIG. 3 and FIG. 4, the moving mechanism 20 further includes a rail 22 and a slider 23, the rail 22 is disposed on the body 10 and extends into the inside of the body 10, and the slider 23 is disposed on the rail 22. The sample tube 21 is set on the slider 23. The driving device 30 (see FIG. 1) drives the slider 23 to move along the rail 22, and the slider 23 drives the sample tube 21 to move along the moving path. The probe 40 is located below the rail 22. Preferably, as shown in FIG. 5 and FIG. 6 and FIG. 7, the light source 60 includes a base 61, a plurality of light-emitting elements 62, and a reflective element 63. The base 61 is disposed on the rail 22. The reflective element 63 is disposed on the base 61 and has a reflective hole 631. The light-emitting elements 62 are fixed to the base 61 and located in the reflective hole 631.

As shown in FIG. 8, and also referring to FIG. 3, when the slider 23 moved the sample tube 21 to the inside of the light source 60, the position of the base 61 is located at the outer side of the moving path of the sample tube 21 and is aligned with the sample tube 21. The moving path of the light-emitting elements 62 is parallel to the direction of the length of the sample tube 21. At this point, the light-emitting elements 62 are activated to emit light. After being reflected by the reflection hole 631, the light passes through the transparent sample tube 21 to irradiate the sample. The sample is stimulated by the light to produce a chemical reaction or an enzyme-catalyzed reaction. Based on the principle of light reflection, the light reflected by the reflection hole 631 is concentrated to enhance the brightness, improve the irradiation efficiency, and further enhance the effect of the light on stimulating the sample.

As shown in FIG. 7, preferably, the inner surface of the reflective hole 631 is an optical reflective curved surface 6311. More specifically, the optical reflective curved surface 6311 is arc-shaped and has an inner diameter gradually increasing away from the light-emitting element 62. As such, the optical reflective curved surface 6311 has an excellent light reflection effect, better light concentration effect, stronger brightness, better irradiation efficiency, and better light stimulation effect on samples.

As shown in FIGS. 10 to 14, the difference between the second embodiment and the first embodiment is that: first, the base 61A is disposed on the rail 22 and above the sample tube 21, and can be positioned along the rail 22. Second, the light source 60A includes a light-emitting element 62, and an axis 621 of the light-emitting element 62 is aligned with an axis 211 of the sample tube 21 (see FIG. 15). Third, the light source 60A further includes a light guide 64 (see FIG. 15). The light guide 64 is disposed in the sample tube 21, and one end of the light guide 64 faces the light-emitting element 62. Fourth, the body 10 includes an adjustment structure 11, the adjustment structure 11 is a rod and connected to the light source 60A, the length of the rod can be adjusted, and thereby the position of the light source 60A within the body 10 is adjustable.

Figure 15:
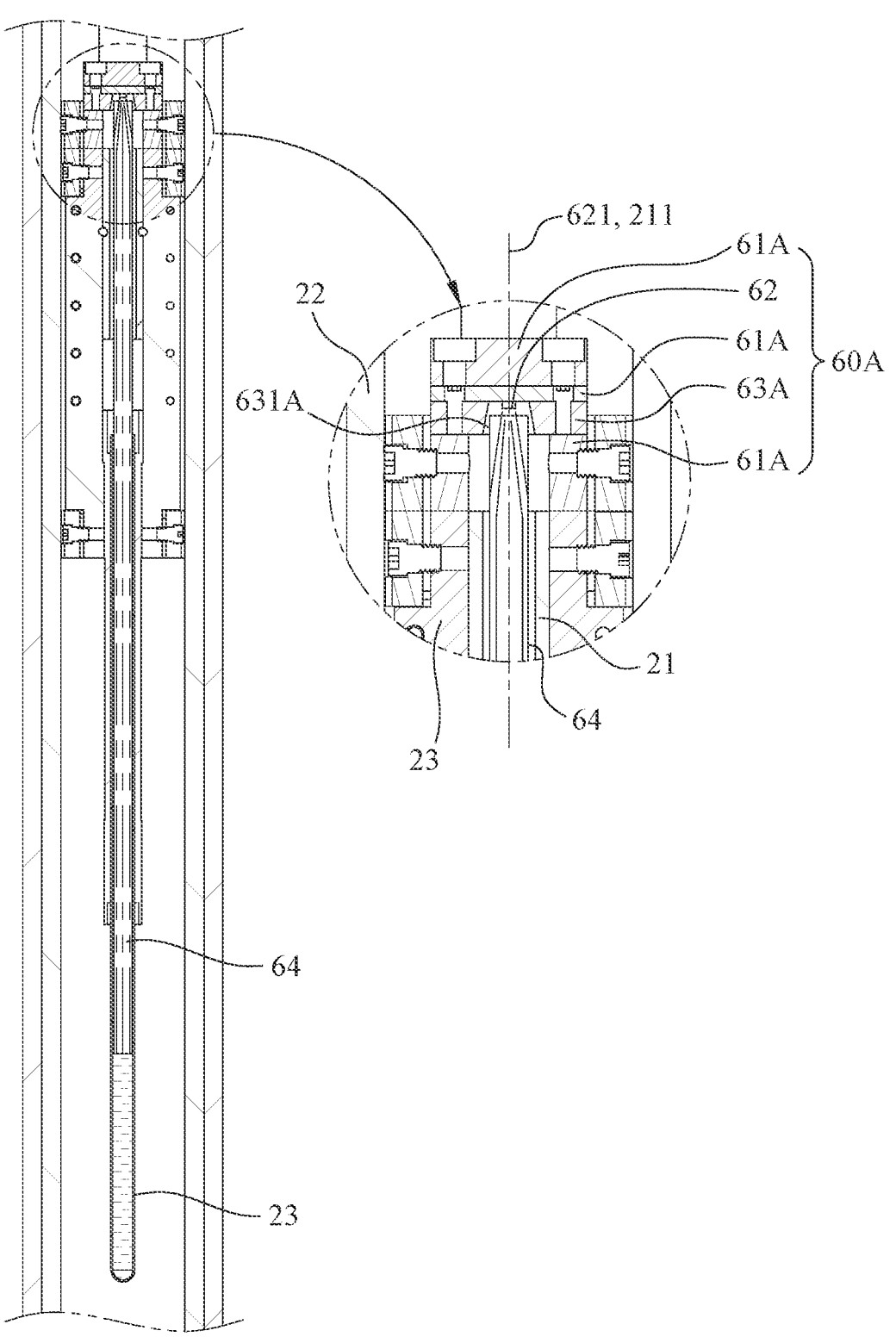
FIG. 15 is a schematic view of a light source emitting light to irradiate a sample tube according to the second embodiment of the present invention.
Figure 16:
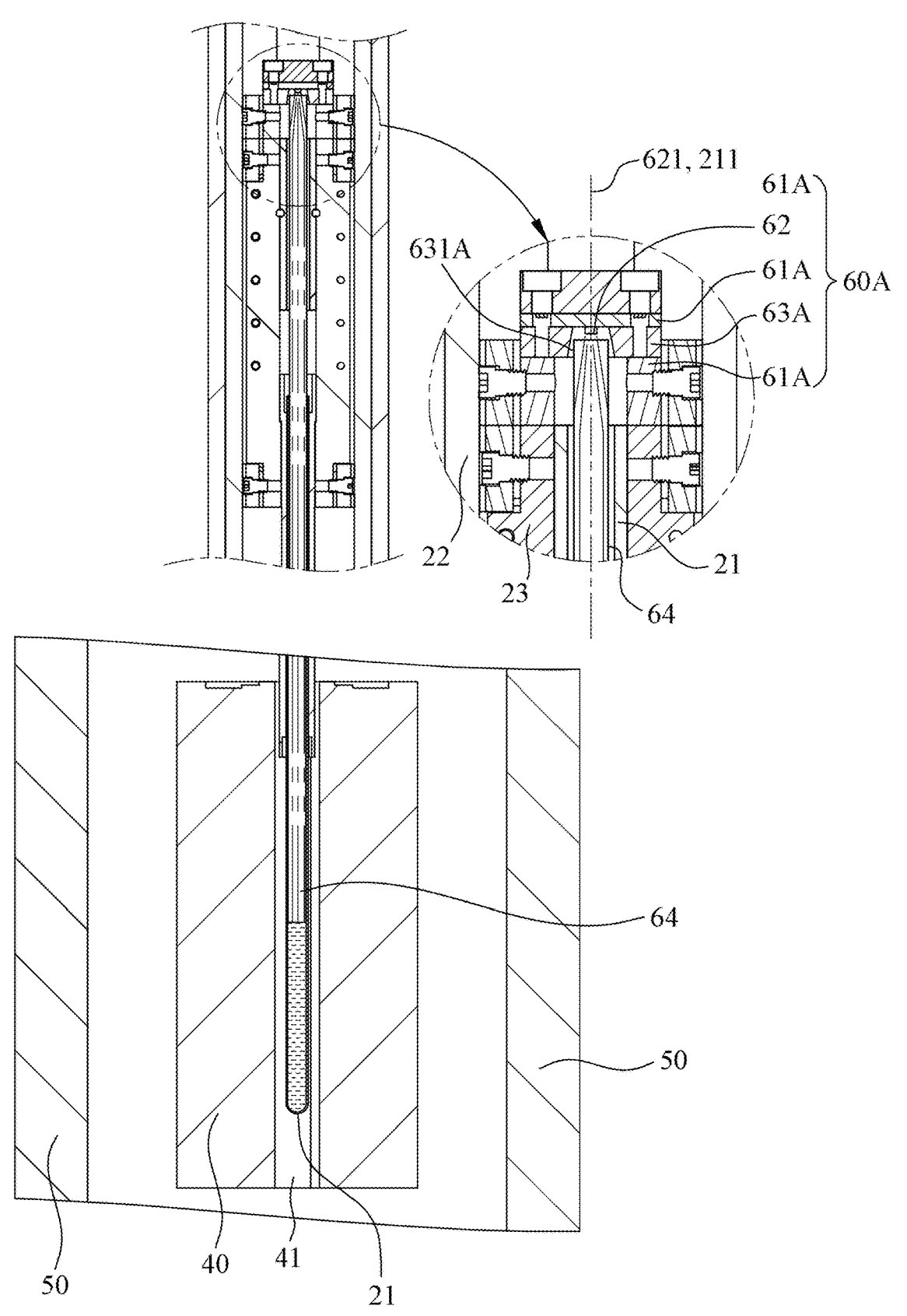
FIG. 16 is a schematic view of the light source irradiating the sample tube inside the probe according to the second embodiment of the present invention.

As shown in FIG. 15 and FIG. 16, when the slider 23 moves the sample tube 21 below the light source 60A, the base 61A is located above the sample tube 21. At this point, the light-emitting element 62 is activated to emits light, and the light enters the light guide 64 after being reflected by the reflection hole 631. The light is guided by the light guide 64 to irradiate the sample, and the sample is stimulated by the light to produce a chemical reaction or an enzyme-catalyzed reaction.

The second embodiment can be operated in two modes. The first mode of operation of the second embodiment is: first, as shown in FIG. 15, the light source 60A irradiates the sample tube 21; then, as shown in FIG. 9, the sample tube 21 is moved into the probe 40, and the probe 40 and the superconducting magnet 50 jointly perform nuclear magnetic resonance on the sample.

The second mode of operation of the second embodiment is: first, as shown in FIG. 16, the sample tube 21 is moved into the probe 40; then, as shown in FIG. 16, the light source 60A irradiates the sample tube 21, and the probe 40 and the superconducting magnet 50 jointly perform nuclear magnetic resonance on the sample.

Figure 17:
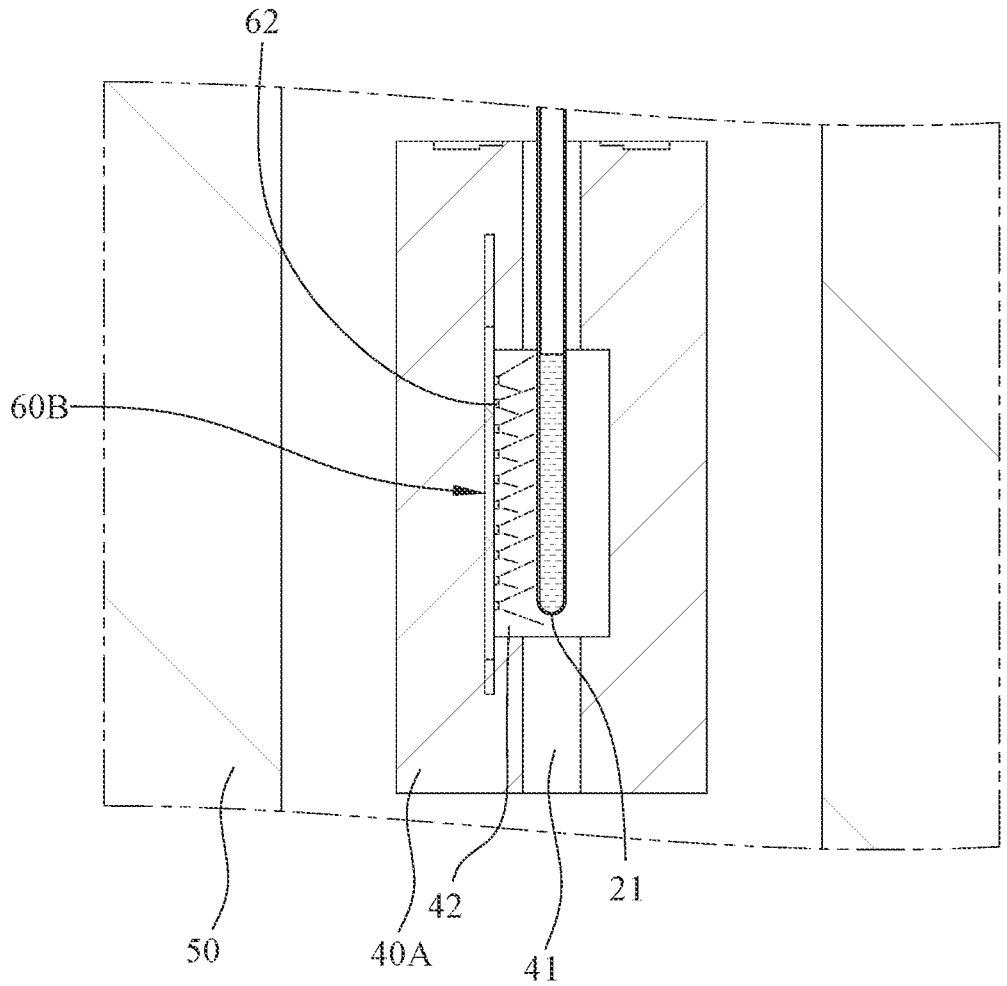
FIG. 17 is a schematic view of the light source irradiating the sample tube located in the chamber of the probe according to the third embodiment of the present invention.

As shown in FIG. 17, the differences between the third embodiment and the first embodiment are: first, there is a chamber 42 inside the probe 40A, and the chamber 42 communicates with the channel 41; second, the light-emitting elements 62 is fixed inside the chamber 42.

As shown in FIG. 17, when the slider 23 moves the sample tube 21 through the channel 41 and into the chamber 42, the light source 60B is located at the outer side of the moving path of the sample tube 21. At this point, the light-emitting elements 62 is activated to emit light, and the light passes through the chamber 42 to irradiate the sample through the transparent sample tube 21, and the sample is stimulated by the light to produce a chemical reaction or an enzyme catalyzed reaction. The probe 40 and the superconducting magnet 50 jointly perform nuclear magnetic resonance on the sample.

Figure 18:
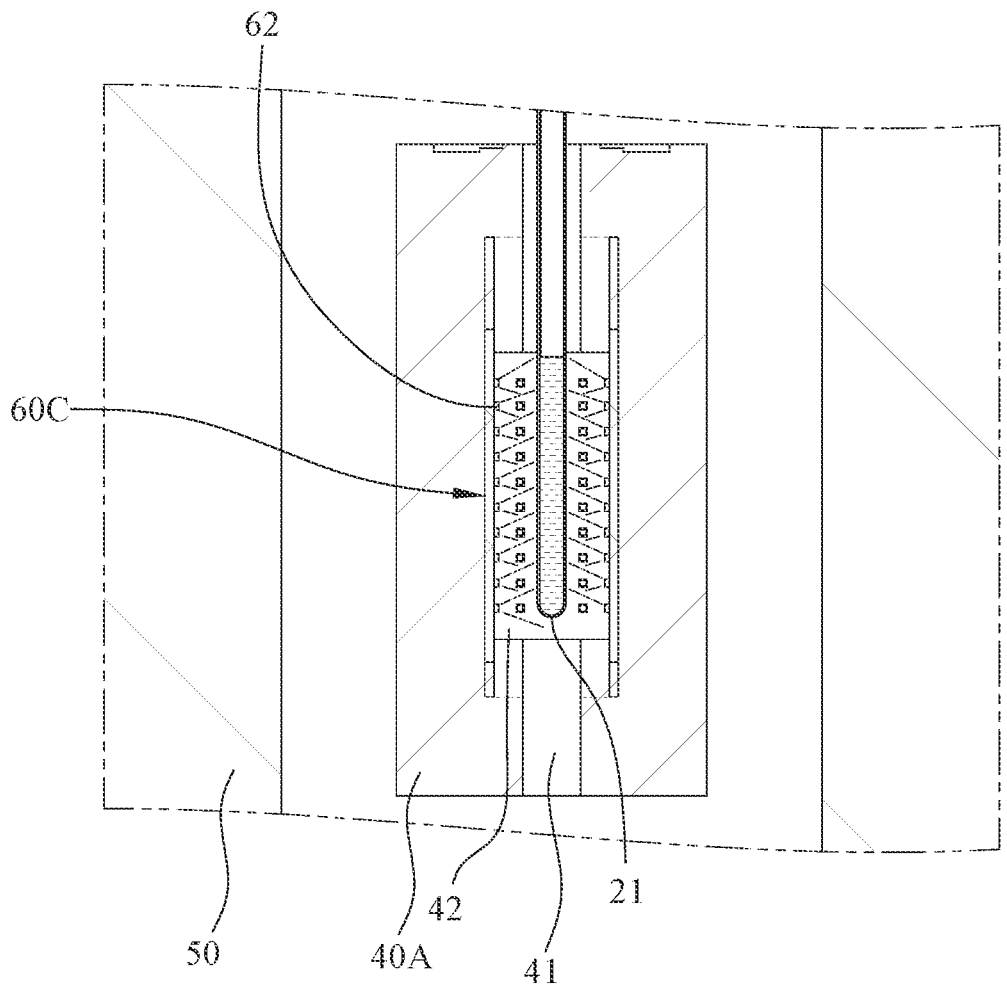
FIG. 18 is a schematic view of the light source irradiating the sample tube located in the chamber of the probe according to the fourth embodiment of the present invention.

As shown in FIG. 18, the difference between the fourth embodiment and the third embodiment is that: the light source 60C surrounds the outside of the chamber 42, and the light-emitting elements 62 are distributed around the chamber 42. As such, the light can evenly pass through the transparent sample tube 21 from around the chamber 42 to irradiate the sample, so that the sample can be evenly stimulated by the light, and the effect of the chemical reaction or enzyme-catalyzed reaction can be improved.

In summary, the light source 60 can directly irradiate the sample tube 21 inside the body 10, without the need to dispose an optical fiber from the outside of the body 10 into the inside of the body 10, and the position of the light source 60 is located at the outer side of the moving path of the sample tube 21 so that the movement of the sample tube 21 will not be hindered.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A nuclear magnetic resonance (NMR) spectrometer, comprising:
   a body;
   a moving mechanism, having a sample tube, a rail and a slider, the rail disposed on the body and extends into the body, the slider disposed on the rail, the sample tube disposed on the slider;
   a driving device, disposed on the body and used for driving the slider to move along the rail, wherein the slider drives the sample tube to move along a moving path;
   a probe, disposed inside the body and located below the rail, and having a channel for the sample tube to enter the probe;
   a superconducting magnet, disposed inside the body and located an outer side of the probe; and
   a light source disposed inside the body, disposed on the rail, and located at an outer side of the moving path of the sample tube or above the sample tube.

2. The NMR spectrometer according to claim 1, wherein the light source comprises a base and at least one light-emitting element, the base is disposed on the moving mechanism, located at the outer side the moving path of the sample tube, and parallel to the moving path of the sample tube; the at least one light-emitting element is fixed to the base.

3. The NMR spectrometer according to claim 2, wherein the light source further comprises a reflective element, the reflective element is disposed on the base and has a reflective hole, and the at least one light-emitting element is located in the reflective hole.

4. The NMR spectrometer according to claim 3, wherein inner surface of the reflective hole is an optical reflective curved surface.

5. The NMR spectrometer according to claim 2, wherein the light source comprises a plurality of light-emitting elements, and the light emitting elements are arranged in a direction parallel to the length direction of the sample tube.

6. The NMR spectrometer according to claim 2, wherein when the light source is located above the sample tube, the body comprises an adjustment structure, the adjustment structure is connected to the light source and used to adjust the position of the light source in the body.

7. The NMR spectrometer according to claim 6, wherein the adjustment structure is a rod, and the rod has an adjustable length.

8. The NMR spectrometer according to claim 1, wherein the light source comprises a base, a light-emitting element, and a light guide, the base is disposed in the moving mechanism and located above the sample tube, and can move along the moving mechanism; the light-emitting element is fixed to the base, the light guide is disposed in the sample tube, and one end of the light guide faces the light-emitting element.

9. The NMR spectrometer according to claim 8, wherein the light source further comprises a reflective element, the reflective element is disposed on the base and has a reflective hole, and the light-emitting element is located in the reflective hole.

10. The NMR spectrometer according to claim 9, wherein inner surface of the reflective hole is an optical reflective curved surface.

11. The NMR spectrometer according to claim 8, wherein an axis of the light-emitting element is aligned with an axis of the sample tube.

12. The NMR spectrometer according to claim 1, wherein the light source is disposed in the probe, and is located at an outer side of the moving path of the sample tube.

13. The NMR spectrometer according to claim 12, wherein the probe has an internal chamber, the chamber communicates with the channel, and the sample tube enters the chamber through the channel; wherein, the light source includes at least one light-emitting element, and the at least one light-emitting element is fixed inside the chamber.

14. The NMR spectrometer according to claim 13, wherein the light source comprises a plurality of light-emitting elements, and the light-emitting elements are arranged in a direction parallel to the length direction of the sample tube.

15. The NMR spectrometer according to claim 13, wherein the light source surrounds the outside of the chamber, the light source includes a plurality of light-emitting elements, and the light emitting elements are located inside the chamber and distributed around the chamber.

* * * * *